(12) United States Patent
Wan et al.

(10) Patent No.: US 11,201,260 B2
(45) Date of Patent: Dec. 14, 2021

(54) SEMICONDUCTOR CHIP OF LIGHT EMITTING DIODE HAVING QUANTUM WELL LAYER STACKED ON N-TYPE GALLIUM NITRIDE LAYER

(71) Applicant: XIAMEN CHANGELIGHT CO., LTD., Fujian (CN)

(72) Inventors: Zhi Wan, Xiamen (CN); Gang Yao, Xiamen (CN); Xiangjing Zhuo, Xiamen (CN); Zhiwei Lin, Xiamen (CN)

(73) Assignee: XIAMEN CHANGELIGHT CO., LTD., Fujian (CN)

( * ) Notice: Subject to any disclaimer, the term of this patent is extended or adjusted under 35 U.S.C. 154(b) by 3 days.

(21) Appl. No.: 16/569,610

(22) Filed: Sep. 12, 2019

(65) Prior Publication Data

US 2020/0091374 A1   Mar. 19, 2020

(30) Foreign Application Priority Data

Sep. 14, 2018  (CN) .......................... 201811072704.4

(51) Int. Cl.
*H01L 33/06* (2010.01)
*H01L 33/32* (2010.01)
*H01L 33/00* (2010.01)
*H01L 33/14* (2010.01)
*H01L 33/36* (2010.01)
(Continued)

(52) U.S. Cl.
CPC .............. *H01L 33/06* (2013.01); *C23C 16/18* (2013.01); *H01L 33/0025* (2013.01); *H01L 33/0075* (2013.01); *H01L 33/12* (2013.01); *H01L 33/145* (2013.01); *H01L 33/32* (2013.01); *H01L 33/36* (2013.01); *H01L 33/44* (2013.01); *H01L 2933/0016* (2013.01); *H01L 2933/0025* (2013.01)

(58) Field of Classification Search
CPC ......... H01L 33/06; H01L 33/32; H01L 33/36; H01L 33/145; H01L 33/12; H01L 33/14; H01L 33/325; H01L 33/04
See application file for complete search history.

(56) References Cited

U.S. PATENT DOCUMENTS 9,614,121 B1 * 4/2017 Choi ................... H01L 33/007
2010/0019223 A1 * 1/2010 Kang ................... H01L 33/06
257/13

(Continued)

*Primary Examiner* — Michael Jung
(74) *Attorney, Agent, or Firm* — Raymond Y. Chan; David and Raymond Patent Firm

(57) ABSTRACT

A semiconductor chip of a light emitting diode includes a substrate, and an N-type gallium nitride layer, a quantum well layer, and a P-type gallium nitride layer stacked on the substrate successively, an N-type electrode electrically connected to the N-type gallium nitride layer, and a P-type electrode electrically connected to the P-type gallium nitride layer. The quantum well layer includes at least one quantum barrier and at least one quantum well stacked successively in sequence, wherein the growth pressure of the quantum barrier and the growth pressure of the quantum well are different, such that the interface crystal quality between the quantum well and the quantum barrier of the quantum well layer can be greatly improved to enhance the luminous efficiency of the semiconductor chip.

19 Claims, 5 Drawing Sheets

(51) Int. Cl.
  *H01L 33/44*  (2010.01)
  *C23C 16/18*  (2006.01)
  *H01L 33/12*  (2010.01)

(56) References Cited

U.S. PATENT DOCUMENTS

| | | | |
|---|---|---|---|
| 2011/0108798 A1* | 5/2011 | Song | H01L 33/0093 257/13 |
| 2013/0168639 A1* | 7/2013 | Lee | H01L 33/14 257/13 |
| 2019/0207059 A1* | 7/2019 | Shur | H01L 33/007 |

* cited by examiner

SEMICONDUCTOR CHIP OF LIGHT EMITTING DIODE HAVING QUANTUM WELL LAYER STACKED ON N-TYPE GALLIUM NITRIDE LAYER

CROSS REFERENCE OF RELATED APPLICATION

This is a non-provisional application that claims the benefit of priority under 35 U.S.C. § 119 to a Chinese application, application number CN 201811072704.4, filed Sep. 14, 2018.

BACKGROUND OF THE PRESENT INVENTION

Field of Invention

The present invention relates to light emitting diode, and more particularly to a semiconductor chip of a light emitting diode, a quantum well layer thereof, and a manufacturing method thereof.

Description of Related Arts

In recent years, with the widespread promotion and application of LED (Light Emitting Diode), related technology of LED has also rapidly developed. As a direct bandgap semiconductor, III-V nitride has excellent physical properties including wide band gap, high breakdown electric field and high electron saturation mobility, and has been widely used in the field of LED. In particular, semiconductor chips based on AlInGaN receive more and more attention due to superior device performance and wide application prospects. Since almost all of the light sources of semiconductor chip are derived from the multiple quantum well layers of the semiconductor chip, the structure of the quantum well layers, the crystal quality between the quantum well and quantum barrier, and the mutant design between the quantum well and quantum barrier are especially important for the design of semiconductor chip. That is, the design of the quantum well layer is the key to the design of the entire semiconductor chip. Because of the difference in material composition and growth conditions between the quantum well and quantum barrier of the quantum well layers of the semiconductor chip, the difference between the well and barrier crystals is inevitably caused, thereby affecting the luminous efficiency and optical performance of the entire device. However, in the actual manufacturing process, the well and barrier of the quantum well layers of the semiconductor chip is grown under the same pressure. For example, in a blue-green semiconductor chip, the quantum well of the quantum well layer is the main light-emitting layer, and the material of the quantum well is InGaN generally. If the growth pressure of the quantum well of the quantum well layer is too low, the incorporation efficiency of the In element increases, but at the same time, the wavelength continuity and homogeneity are destroyed, which is shown as increase in half width and illumination of sideband to affect the stability of light illumination. If the growth pressure of the quantum well of the quantum well layer is too high, the atomic mobility is affected, and the quantum well tends to grow in three dimensions, which causes the surface of the quantum well to be roughened and affects the crystal quality. So, in the conventional growth process, the growth of the quantum well of the quantum well layer is regulated under steady pressure. But because the material compositions of the quantum well and the quantum barrier of the quantum well layer are different, resulting in a poor quality of the interface crystal quality between the quantum well and the quantum barrier of the quantum well layer grown under the same pressure is poorer.

SUMMARY OF THE PRESENT INVENTION

The invention is advantageous in that it provides a semiconductor chip of a light emitting diode, a quantum well layer thereof and a manufacturing method thereof, wherein the interface crystal quality between the quantum well and the quantum barrier of the quantum well layer can be greatly improved to enhance the luminous efficiency of the semiconductor chip.

Another advantage of the invention is to provide a semiconductor chip of a light emitting diode, a quantum well layer thereof and a manufacturing method thereof, wherein the growth pressures of the quantum well and the quantum barrier of the quantum well layer are different, so as to improve the interface crystal quality between the quantum well and the quantum barrier of the quantum well layer.

Another advantage of the invention is to provide a semiconductor chip of a light emitting diode, a quantum well layer thereof and a manufacturing method thereof, wherein the growth pressure of the quantum barrier of the quantum well layer is lower than the growth pressure of the quantum well, so as to improve the well-barrier interface crystal quality between the quantum well and the quantum barrier.

Another advantage of the invention is to provide a semiconductor chip of a light emitting diode, a quantum well layer thereof and a manufacturing method thereof, wherein the growth pressure of the quantum barrier of the quantum well layer is lower than the growth pressure of the quantum well, in such a manner that the atomic mobility of the quantum barrier can be enhanced to promote two-dimensional growth of the surface of the quantum barrier, and to facilitate the improvement of the well-barrier interface crystal quality between the quantum well and the quantum barrier.

Another advantage of the invention is to provide a semiconductor chip of a light emitting diode, a quantum well layer thereof and a manufacturing method thereof, wherein the growth pressure of the quantum barrier of the quantum well layer is lower than the growth pressure of the quantum well to promote incorporation of group III element. For example, promoting incorporation of In element into the quantum barrier by making the growth pressure of the quantum barrier lower than the growth pressure of the quantum well, such that when the semiconductor chip of the blue-green light is grown, it is possible to provide more quantum dots to enhance the luminous efficiency of the semiconductor chip.

Another advantage of the invention is to provide a semiconductor chip of a light emitting diode, a quantum well layer thereof and a manufacturing method thereof, wherein the semiconductor chip provides a current spreading layer, wherein the current spreading layer enables the current to be uniformly spread over the semiconductor chip for improving the luminous efficiency of the semiconductor chip.

Another advantage of the invention is to provide a semiconductor chip of a light emitting diode, a quantum well layer thereof and a manufacturing method thereof, wherein the current spreading layer can weaken longitudinal current spreading capability of the semiconductor chip and improve horizontal current spreading capability of the semiconductor chip so that current is uniformly spread over the semiconductor chip.

Another advantage of the invention is to provide a semiconductor chip of a light emitting diode, a quantum well layer thereof and a manufacturing method thereof, wherein in a growth direction of the semiconductor chip, a resistance state of the current spreading layer is in a state of "low resistance-high resistance-low resistance-high resistance . . ." to weaken the longitudinal current spreading capability of the semiconductor chip and to improve the horizontal current spreading capability of the semiconductor chip.

Additional advantages and features of the invention will become apparent from the description which follows, and may be realized by means of the instrumentalities and combinations particular point out in the appended claims.

According to the present invention, the foregoing and other objects and advantages are attained by a semiconductor chip of a light emitting diode, comprising:

a substrate;

an N-type gallium nitride layer, wherein the N-type gallium nitride layer is stacked on the substrate;

a quantum well layer, wherein the quantum well layer is stacked on the N-type gallium nitride layer, wherein the quantum well layer comprises one or more quantum barriers and one or more quantum wells stacked successively in sequence, wherein growth pressures of the quantum barrier and the growth pressure of the quantum well are different;

a P-type gallium nitride layer, which is stacked on the quantum well layer;

an N-type electrode, which is electrically connected to the N-type gallium nitride layer; and a P-type electrode, which is electrically connected to the P-type gallium nitride layer.

According to one embodiment of the present invention, the growth pressure of the quantum barrier of the quantum well layer is lower than the growth pressure of the quantum well.

According to one embodiment of the present invention, the number of layers of the quantum barrier of the quantum well layer and the number of layers of the quantum well are both parameterized as N, wherein the parameter N has a value range of: 3≤N≤20.

According to one embodiment of the present invention, the quantum barrier of the quantum well layer is a doped quantum barrier of $Al_{x1}In_{y1}Ga_{1-x1-y1}N$ (0<X1<1, 0<Y1<1), and the doping concentration is $1-5\times10^{18}$ cm$^{-3}$, wherein the quantum well of the quantum well layer is an undoped quantum well of $Al_{x2}In_{y2}Ga_{1-x2-y2}N$ (0<X2<1, 0<Y2<1).

According to one embodiment of the present invention, the quantum barrier of the quantum well has a thickness ranging from 5 nm to 15 nm, and the quantum well has a thickness ranging from 2 nm to 5 nm.

According to one embodiment of the present invention, the semiconductor chip further comprises a buffer layer, wherein the buffer layer is stacked on the substrate, wherein the N-type gallium nitride layer is stacked on the buffer layer.

According to one embodiment of the present invention, the buffer layer is a GaN buffer layer or an AlN buffer layer.

According to one embodiment of the present invention, the semiconductor chip further comprises a current spreading layer, wherein the current spreading layer is stacked on the N-type gallium nitride layer, wherein the quantum well layer is stacked on the current spreading layer.

According to one embodiment of the present invention, the current spreading layer is an N-type current spreading layer; or the current spreading layer is an AlGaN type current spreading layer; or the current spreading layer is an InGaN current spreading layer.

According to one embodiment of the present invention, the semiconductor chip further comprises a protective layer, wherein the protective layer is stacked on the quantum well layer, and the P-type gallium nitride layer is stacked on the protective layer.

According to one embodiment of the present invention, the semiconductor chip further comprises an electron blocking layer, wherein the electron blocking layer is stacked on the protective layer, and the P-type gallium nitride layer is stacked on the electron blocking layer.

According to one embodiment of the present invention, the N-type electrode is stacked on the current spreading layer, and the P-type electrode is stacked on the P-type gallium nitride layer.

According to another aspect of the present invention, the present invention further provides a quantum well layer applied in a semiconductor chip, wherein the quantum well layer comprises one or more quantum barriers and one or more quantum wells stacked in sequence successively, wherein the growth pressure of the quantum barrier and the growth pressure of the quantum well are different.

According to an embodiment of the present invention, the growth pressure of the quantum barrier of the quantum well layer is lower than the growth pressure of the quantum well.

According to an embodiment of the present invention, the number of layers of the quantum barrier of the quantum well layer and the number of layers of the quantum well are both parameterized as N, wherein the parameter N has a value range of: 3≤N≤20.

According to an embodiment of the present invention, the quantum barrier of the quantum well layer is a doped quantum barrier of $Al_{x1}In_{y1}Ga_{1-x1-y1}N$ (0<X1<1, 0<Y1<1), and the doping concentration is $1-5\times10^{18}$ cm$^{-3}$, wherein the quantum well of the quantum well layer is an undoped quantum well of $Al_{x2}In_{y2}Ga_{1-x2-y2}N$ (0<X2<1, 0<Y2<1).

According to one embodiment of the present invention, the quantum barrier of the quantum well has a thickness ranging from 5 nm to 15 nm, and the quantum well has a thickness ranging from 2 nm to 5 nm.

According to another aspect of the present invention, the present invention further provides a manufacturing method of a semiconductor chip of a light emitting diode, wherein the manufacturing method comprises the steps of:

(a) stacking an N-type gallium nitride layer on a substrate;

(b) cyclically growing one or more quantum barriers and one or more quantum wells from the N-type gallium nitride layer to form a quantum well layer by the quantum barriers and the quantum wells stacked on the N-type gallium nitride layer, wherein the growth pressure of the quantum barrier and the growth pressure of the quantum well are different;

(c) stacking a P-type gallium nitride layer on the quantum well layer; and (d) electrically connecting an N-type electrode to the N-type gallium nitride layer and electrically connecting a P-type electrode to the P-type gallium nitride layer to produce the semiconductor chip.

According to one embodiment of the present invention, the cycle times for growing the quantum barrier and the quantum well is from 3 cycles to 20 cycles.

According to one embodiment of the present invention, the growth pressure of the quantum barrier is lower than the growth pressure of the quantum well.

According to one embodiment of the present invention, in the step (b), the method further comprises the steps of:

(b.1) maintaining the substrate stacked with the N-type gallium nitride layer in a metal-organic chemical vapor deposition device;

(b.2) introducing In source, Ga source, nitrogen source, and silane to the metal-organic chemical vapor deposition device to grow the quantum barrier doped $Al_{x1}In_{y1}Ga_{1-x2-y2}N$ (0<X1<1, 0<Y1<1) to form the quantum barrier stacked on the N-type gallium nitride layer;

(b.3) reducing a pressure of the metal-organic chemical vapor deposition device, and introducing In source, Ga source, and nitrogen source to the metal-organic chemical vapor deposition device to grow quantum well undoped $Al_{x2}In_{y2}Ga_{1-x2-y2}N$ (0<X2<1, 0<Y2<1) to form the quantum well stacked on the quantum barrier; and (b.4) circulating the step (b.2) and the step (b.3) to stack the quantum well layer on the N-type gallium nitride layer.

According to one embodiment of the present invention, the doping concentration of the quantum barrier of the quantum well layer is $1-5 \times 10^{18}$ cm$^{-3}$.

According to one embodiment of the present invention, the quantum barrier of the quantum well layer has a thickness ranging from 5 nm to 15 nm, and the quantum well has a thickness ranging from 2 nm to 5 nm.

According to one embodiment of the present invention, before the step (a), the manufacturing method further comprises a step of growing a buffer layer from the substrate, so that in the step (a), the N-type nitrogen gallium layer is grown on the buffer layer.

According to one embodiment of the present invention, before the step (b), the manufacturing method further comprises a step of growing a current spreading layer from the N-type gallium nitride layer, so that in the step (b), the quantum well layer is grown on the current spreading layer.

According to one embodiment of the present invention, before the step (c), the method further comprises the steps of: growing a protective layer from the quantum well layer and growing an electron blocking layer from the protective layer, so that in the step (c), the P-type gallium nitride layer is grown on the electron blocking layer.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
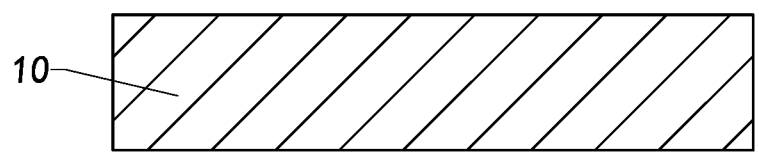
FIG. 1 is a sectional view illustrating a step one of a manufacturing method of a semiconductor chip according to a preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

As shown in FIGS. 1 to 9 of the present invention, a semiconductor chip of a light emitting diode according to a preferred embodiment of the present invention is disclosed and illustrated in the following description. The semiconductor chip comprises a substrate 10, an N-type gallium nitride layer 20, a quantum well layer 30, a P-type gallium nitride layer 40, an N-type electrode 50, and a P-type electrode 60, wherein the N-type gallium nitride layer 20 is stacked on the substrate 10, the quantum well layer 30 is stacked on the N-type gallium nitride layer 20, the P-type gallium nitride layer 40 is stacked on the quantum well layer 30, the N-type electrode 50 is electrically connected to the N-type gallium nitride layer 20, and the P-type electrode 60 is electrically connected to the P-type gallium nitride layer 40. When the N-type electrode 50 and the P-type electrode 60 of the semiconductor chip are respectively inputted with power source, a current flowing from the N-type electrode 50 into the semiconductor chip can enter the well layer 30 through the N-type gallium nitride layer 20, and a current flowing from the P-type electrode 60 into the semiconductor chip can enter the quantum well layer 30 through the P-type gallium nitride layer 40, such that the currents are combined at the quantum well layer 30 to produce light.

Specifically, the quantum well layer 30 comprises one or more quantum wells and one or more quantum barriers stacked successively in sequence, wherein an interface crystal quality between the quantum well and the quantum barrier of the quantum well layer 30 can be greatly improved to enhance the luminous efficiency of the semiconductor chip. More specifically, both the number of the quantum wells and the number of the quantum barrier of the quantum well layer 30 are defined as parameter N. That is, in the process of manufacturing the semiconductor chip, the quantum wells and quantum barriers are grown in N cycles to form the quantum well layer 30, such that the first quantum barrier of the quantum well layer 30 is stacked on the N-type gallium nitride layer 20, and the first quantum well of the quantum well layers 30 is stacked on the first quantum barrier, and that the second quantum barrier of the quantum well layer 30 is stacked on the first quantum well, and the second quantum well of the quantum well layers 30 is stacked on the second quantum well, and so on. The Nth quantum barrier of the quantum well layer 30 is stacked on the N-1th quantum well, and the Nth quantum well of the quantum well layer 30 is stacked on the Nth quantum barrier, wherein the interface crystal quality between the adjacent quantum well and the quantum barrier can be greatly improved, for enhancing the luminous efficiency of the semiconductor chip. For example, the uniformity of the interface crystal quality between the quantum well and the quantum barrier of the quantum well layer 30 can be improved, for enhancing the interface crystal quality between the quantum well and the quantum barrier.

In this preferred embodiment of the semiconductor chip, as shown in FIGS. 1 to 9, the parameter N has a value range of $3 \leq N \leq 20$, that is, the quantum well layer 30 of the semiconductor chip comprises the quantum barriers and the quantum wells in 3 to 20 cycles (including 3 cycles and 20 cycles). In other words, the number of layers of the quantum barrier of the quantum well layer 30 of the semiconductor chip and the number of layers of the quantum well both are 3 to 20 layers (including 3 layers and 20 layers).

According to this preferred embodiment of the semiconductor chip of the present invention, the quantum barrier of the quantum well layer 30 and the quantum well have different growth pressures, depending on the material of the quantum barrier and the quantum well. A suitable pressure is selected in such a manner that the interface crystal quality between the quantum well and the quantum barrier can be greatly improved to enhance the luminous efficiency of the semiconductor chip.

Specifically, in a preferred embodiment of the semiconductor chip of the present invention, the growth pressure of the quantum barrier of the quantum well layer 30 is lower than the growth pressure of the quantum well to improve the interface crystal quality between the quantum well and the quantum barrier of the quantum well layer 30. In the process of growing the quantum well layer 30, when the quantum barrier of the quantum well layer 30 is grown in a lower pressure growth environment, atomic migration of the quantum barrier can be enhanced to promote the surface of the quantum barrier grown two-dimensionally, which facilitates the improvement of the well-barrier interface crystal quality between the quantum well and the quantum barrier.

Preferably, the N-type gallium nitride layer 20 of the semiconductor chip is a silicon (Si) doped gallium nitride layer, wherein the N-type gallium nitride layer 20 has a doping concentration of $1–10 \times 10^{18}$ cm$^{-3}$. More preferably, the N-type gallium nitride layer 20 of the semiconductor chip has a thickness ranging from 3 μm to 6 μm (including 3 μm and 6 μm).

Preferably, the P-type gallium nitride layer 40 of the semiconductor chip is a doped gallium nitride layer, wherein the P-type gallium nitride layer 40 has a doping concentration of $5–10 \times 10^{18}$ cm$^{-3}$. More preferably, the P-type gallium nitride layer 40 of the semiconductor chip has a thickness ranging from 100 nm to 200 nm (including 100 nm and 200 nm).

In addition, the material of the N-type electrode 50 is Ti (titanium) or Al (aluminum). Correspondingly, the material of the P-type electrode 60 is Ni (nickel) or Au (gold).

Further referring to FIGS. 1 to 9, the semiconductor chip further comprises a buffer layer 70, wherein the buffer layer 70 is stacked on the substrate 10 and the N-type gallium nitride layer 20 is stacked on the buffer layer 70. The N-type gallium nitride layer 20 is stacked on the substrate 10 such that the N-type gallium nitride layer 20 is stacked on the substrate 10. Accordingly, the N-type gallium nitride layer 20 is stacked on the buffer layer 70 and the buffer layer 70 is stacked on the substrate 10. In the semiconductor chip, the buffer layer 70 can avoid the problem of lattice mismatch in a manner of being retained between the N-type gallium nitride layer 20 and the substrate 10, so as to facilitate the assurance of the stability and reliability of semiconductor chips.

In a preferred embodiment of the semiconductor chip of the present invention, the buffer layer 70 is a gallium nitride buffer layer. For example, the buffer layer 70 may be, but not limited to, an undoped gallium nitride buffer layer. When the buffer layer 70 is an undoped gallium nitride buffer layer, the buffer layer 70 has a thickness ranging from 20 nm to 50 nm (including 20 nm and 50 nm). Alternatively, in other embodiments of the semiconductor chip of the present invention, the buffer layer 70 is an AlN buffer layer.

Please further referring to FIGS. 1-9, the semiconductor chip further comprises a current spreading layer 80, wherein the current spreading layer 80 is stacked on the N-type gallium nitride layer 20 and the quantum well layer 30 is stacked on the N-type gallium nitride layer 20. Accordingly, the quantum well layer 30 is stacked on the current spreading layer 80 and the current spreading layer 80 is stacked on the N-type gallium nitride layer 20. The N-type electrode 50 is electrically connected to the N-type gallium nitride layer 20 in a manner that the N-type electrode 50 is electrically connected to the current spreading layer 80 and the current spreading layer 80 is electrically connected to the N-type gallium nitride layer 20, such that a current flowing through the N-type electrode 50 can enter the quantum well layer 30 through the N-type gallium nitride layer 20 after being expanded and spread by the current spreading layer 80.

In a preferred embodiment of the semiconductor chip of the present invention, the current spreading layer 80 is an N-type current spreading layer. Alternatively, in another preferred embodiment of the semiconductor chip of the present invention, the current spreading layer 80 is AlGaN current spreading layer or InGaN current spreading layer.

Furthermore, when the current spreading layer 80 is an N-type current spreading layer, the current spreading layer 80 comprises at least one N—GaN layer and at least one U—GaN layer, wherein the N—GaN layer and the U—GaN layers are stacked one on another, such that the current spreading layer 80 can have a "low resistance-high resistance-low resistance-high resistance . . . " kind of resistance state in growth direction. Accordingly, on the one hand, the current spreading layer 80 causes the longitudinal resistance of the semiconductor chip to be increased to weaken the longitudinal current spreading capability of the semiconductor chip.

On the other hand, the current spreading layer 80 enables the horizontal current spreading capability of the semiconductor chip to be effectively improved. Thereby, it is advantageous for the current to be uniformly distributed and to improve the luminous efficiency, which has a large improvement in the luminous performance and the service life span of the semiconductor chip.

Referring to FIGS. 1 to 9, the semiconductor chip further comprises a protective layer 90, wherein the protective layer 90 is stacked on the quantum well layer 30 to maintain crystal quality of the quantum well layer 30, for avoiding destruction of the composition and structure of the quantum well layer 30 during next growth process. Preferably, the protective layer 90 is a GaN cap layer. Preferably, the protective layer 90 has a thickness ranging from 30 nm to 100 nm (including 30 nm and 100 nm).

Referring to FIGS. 1 to 9, the semiconductor chip further comprises an electron blocking layer 100, wherein the electron blocking layer 100 is stacked on the protective layer 90, and the P-type gallium nitride layer 40 is stacked on the quantum well layer 30 in a manner that the P-type gallium nitride layer 40 is stacked on the electron blocking layer 100, the electron blocking layer 100 is stacked on the protective layer 90, and the protective layer 90 is stacked on the quantum well layer 30. The electron blocking layer 100 has a wider bandgap, which can reduce electron leakage, increase the radiation recombination rate, and enhance the luminous efficiency.

Preferably, the electron blocking layer 100 is a P-type AlGaN electron blocking layer. The electron blocking layer 100 has a doping concentration of $1-10\times10^{18}$ cm$^{-3}$. Preferably, the electron blocking layer 100 has a thickness ranging from 0.1 μm to 0.5 μm (including 0.1 μm and 0.5 μm).

In the following description, the substrate 10, the buffer layer 70, the N-type gallium nitride layer 20, the current spreading layer 80, the quantum well layer 30, the protective layer 90, the electron blocking layer 100, the P-type gallium nitride layer 40, the N-type electrode 50, and the P-type electrode 60 and connections thereof are further described with the growth process of the semiconductor chip to illustrate features of the semiconductor chip of the present invention.

In particular, under conditions of a reaction growth pressure ranging from 100 torr to 500 torr (including 100 torr and 500 torr), the buffer layer 70, the N-type gallium nitride layer 20, the current spreading layer 80, the quantum well layer 30, the protective layer 90, the electron blocking layer 100, the P-type gallium nitride layer 40, the N-type electrode 50, and the P-type electrode 60 are sequentially grown from the substrate 10.

More specifically, the growing steps of the semiconductor chip includes:

S1, growing the buffer layer 70 from the substrate 10; S2;

S2, growing the N-type gallium nitride layer 20 from the buffer layer 70;

S3, growing the current spreading layer 80 from the N-type gallium nitride layer 20;

S4, growing the quantum well layer 30 from the current spreading layer 80;

S5, growing the protective layer 90 from the quantum well layer 30;

S6, growing the electron blocking layer 100 from the protective layer 90;

S7, growing the P-type gallium nitride layer 40 from the electron blocking layer 100; and S8, growing the N-type electrode 50 from the current spreading layer 80 and the P-type electrode 60 are grown from the P-type gallium nitride layer 40.

Next, each growth step of the above-described preferred embodiment of the semiconductor chip according to the present invention is described in detail as follows.

Figure 2:
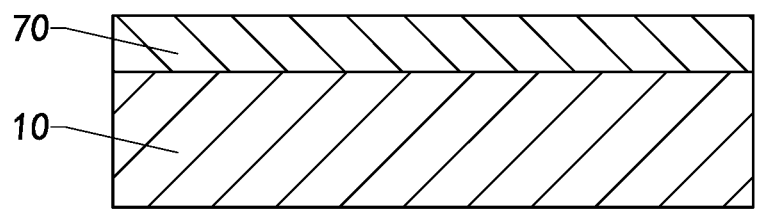
FIG. 2 is a sectional view illustrating a step two of the manufacturing method of the semiconductor chip according to the above preferred embodiment of the present invention.

In step S1, the buffer layer 70 is grown from the substrate 10, as shown in FIG. 2. Specifically, firstly, the substrate 10 is placed in a metal-organic chemical vapor deposition device (MOCVD). Next, high purity hydrogen (H2) is introduced into the metal organic compound vapor phase epitaxy apparatus at a temperature of about 1100° C., wherein the last time of high purity hydrogen (H2) is in the range of 10 minutes to 15 minutes (including 10 minutes and 15 minutes). Thirdly, the Ga source and the N source are introduced into the metal-organic chemical vapor deposition device when the temperature is lowered to 900° C.-1000° C. (including 900° C. and 1000° C.) to grow the buffer layer 70 on the substrate 10, so that the buffer layer 70 is stacked on the substrate 10.

Preferably, the buffer layer 70 is an undoped gallium nitride buffer layer. Preferably, the buffer layer 70 has a thickness ranging from 20 nm to 50 nm (including 20 nm and 50 nm).

It is worth to mention that the type of the substrate 10 is not limited in the semiconductor chip of the present invention. For example, the substrate 10 may be a sapphire substrate, an AlN substrate, a SiC substrate, and a Si substrate.

Figure 3:
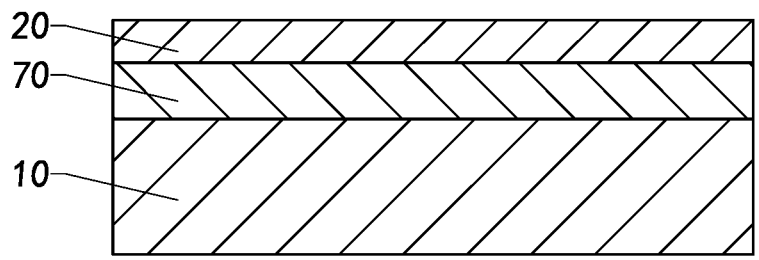
FIG. 3 is a sectional view illustrating a step three of the manufacturing method of the semiconductor chip according to the above preferred embodiment of the present invention.

Next, in step S2, the N-type gallium nitride layer 20 is grown from the buffer layer 70, as shown in FIG. 3. Specifically, Ga source, nitrogen source, and silane (SiH4) are introduced into the metal-organic chemical vapor deposition device when the temperature of the chamber raised up to 1100° C.-1200° C. (including 1100° C. and 1200° C.) to grow silicon (Si)-doped N-type gallium nitride layer 20 from the buffer layer 70, so that the N-type gallium nitride layer 20 is stacked on the buffer layer 70, Ga source/nitrogen source (NH3) is an essential element for growth, and N2 is carrier gas., and silane (SiH4) is dopant source.

It would be understand by person skilled in the art that, since the buffer layer 70 is grown on the substrate 10 and the N-type gallium nitride layer 20 is grown on the buffer layer 70, the buffer layer 70 is maintained between the substrate 10 and the N-type gallium nitride layer 20. Therefore, the problem of lattice mismatch between the substrate 10 and the N-type gallium nitride layer 20 can be avoided, so that it is advantageous to ensure the stability and reliability of the semiconductor chip.

Preferably, the N-type gallium nitride layer 20 has a thickness ranging from 3 μm to 6 μm (including 3 μm and 6 μm). Preferably, the N-type gallium nitride layer 20 has a silicon doping concentration of $1-10\times10^{18}$ cm$^{-3}$.

Figure 4:
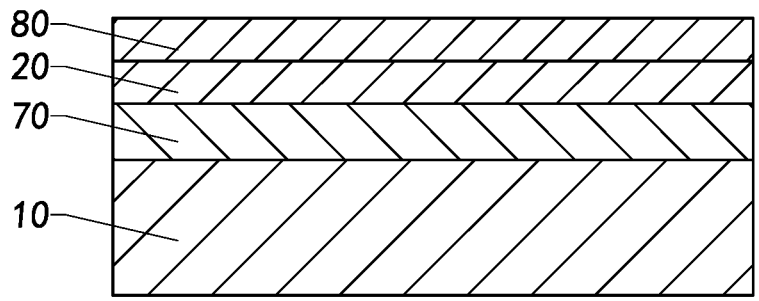
FIG. 4 is a sectional view illustrating a step four of the manufacturing method of the semiconductor chip according to the above preferred embodiment of the present invention.

Next, in the step S3, the current spreading layer 80 is grown from the N-type gallium nitride layer 20, as shown in FIG. 4. For example, in a preferred embodiment of the semiconductor chip of the present invention, after the N-type gallium nitride layer 20 is grown in the buffer layer 70, Ga source, nitrogen source, and silane (SiH4) are continuously introduced into the metal-organic chemical vapor deposition device to grow a silicon-doped N—GaN layer from the N-type gallium nitride layer 20, and then Ga source and nitrogen source are introduced to grow the undoped U—GaN layer on the N—GaN layer, for cyclically growing the N—GaN layer and the U—GaN layer for 5 cycles to 30 cycles (including 5 cycles and 30 cycles), so as to form the current spreading layer 80. Accordingly, the current spreading layer 80 can allow a more even distribution of current.

Specifically, since the N—GaN layer of the current spreading layer 80 is a silicon doped layer and the U—GaN layer is an undoped layer, the N—GaN layer and the U—GaN layer 32 of the current spreading layer 80 have different resistances, so that the current spreading layer 80 can have a "low resistance-high resistance-low resistance-high resistance . . . " resistance state in the growth direction of the semiconductor chip. Accordingly, on the one hand, the current spreading layer 80 causes the longitudinal resistance of the semiconductor chip to be increased, to weaken the longitudinal current spreading capability of the semiconductor chip, and on the other hand, the current spreading layer 80 makes the horizontal current spreading capability of the semiconductor chip being effectively improved, to facilitate uniformly distribution of current and improve luminous efficiency of the semiconductor chip, that has a highly improvement in optical performance and service life span of the semiconductor chip. In addition, a thickness of the N—GaN layer and a thickness of the U—GaN layer of the current spreading layer 80 can affect the resistance of the N—GaN layer and resistance of the U—GaN layer. Thus, by adjusting the thickness of the N—GaN layer and the thickness of the U—GaN layer of the current spreading layer 80, current can be more uniformly distributed to improve the luminous efficiency of the semiconductor chip.

Figure 5:
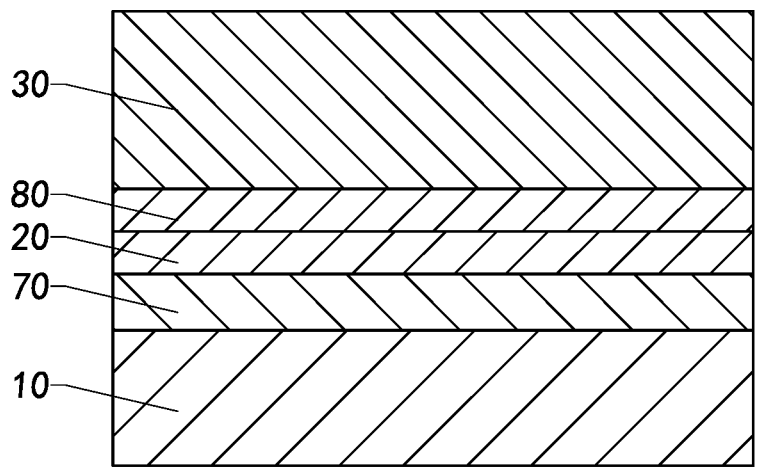
FIG. 5 is a sectional view illustrating a step five of the manufacturing method of the semiconductor chip according to the above preferred embodiment of the present invention.

Next, in the step S4, the quantum well layer 30 is grown from the current spreading layer 80, as shown in FIG. 5. Specifically, firstly, the temperature of a cavity of the metal-organic chemical vapor deposition device is lowered to 800° C.-900° C. (including 800° C. and 900° C.), and In source, Ga source, nitrogen source, and silane (SiH4) are introduced into the cavity of the metal-organic chemical vapor deposition device for growing the quantum barrier from the current spreading layer 80, wherein the quantum barrier has a doping concentration of $1-5\times10^{18}$ cm$^{-3}$, and the quantum barrier is in a thickness range of 5 nm-15 nm (including 5 nm and 15 nm) of $Al_{x1}In_{y1}Ga_{1-x1-y1}N$ (0<X1<1, 0<Y1<1) quantum barrier. Secondly, raising the pressure of the cavity of the metal-organic chemical vapor deposition device to grow the undoped quantum well from the quantum barrier, wherein the quantum well is in a thickness range of 2 nm to 5 nm (including 2 nm and 5 nm) of $Al_{x2}In_{y2}Ga_{1-x2-y2}N$ (0<X2<1, 0<Y2<1) quantum wells. Growing the quantum barrier from the quantum well after lowering the pressure of the cavity of the metal-organic chemical vapor deposition device in the above manner, and after raising the pressure of the cavity of the metal-organic chemical vapor deposition device, the quantum well is grown from the quantum barrier. The growth times are 3 cycles to 20 cycles to form the quantum well layer 30.

In other words, in the semiconductor chip of the present invention, the growth pressure of the quantum barrier of the quantum well layer 30 is lower than the growth pressure of the quantum well. Accordingly, the atomic migration of the quantum barrier can be enhanced to promote the two-dimensional growth of the surface of the quantum barrier, for facilitating the improvement of the well-barrier interface crystal quality between the quantum well and the quantum barrier, to improve the luminous efficiency of the semiconductor chip. Moreover, the growth pressure of the quantum barrier of the quantum well layer 30 is lower than the growth pressure of the quantum well, so that the incorporation of the group III element can be promoted in the process of growing the quantum barrier, such as the In element. Thus, when the blue-green light of the semiconductor chip is grown, more quantum dots can be provided to enhance the luminous efficiency of the semiconductor chip.

For example, in the quantum well layer 30 of AlInGaN, the quantum well has the growth pressure of 200 torr-300 torr (including 200 torr and 300 torr), and the growth pressure of the quantum barrier is lower than the growth pressure of the quantum well. Of course, it should be understood by those skilled in the art that the growth pressure of the quantum barrier of the quantum well layer 30 is lower than the growth pressure of the quantum well by 5 torr-10 torr as an example for disclosure the content and scope of the semiconductor chip of the present invention not to be construed as limiting the description and scope of the present invention. For example, when selecting the growth pressure of the quantum well and the quantum barrier of the quantum well layer 30, a Transmission Electron Microscope (TEM)/X-ray Diffractometer (XRD) may be used to determine the crystal quality of a well-barrier interface of the quantum well and the quantum barrier or luminous efficiency of the semiconductor chip under the same conditions to select suitable growth pressures of the quantum well and the quantum barrier.

It is worth to mention that the structure and growth mode of the quantum well layer 30 of the semiconductor chip of the present invention is applicable to the semiconductor chip of the full color system. For example, the structure and growth mode of the quantum well layer 30 are suitable for InGaN-based blue-green light and AlGaN-based ultraviolet light.

Figure 6:
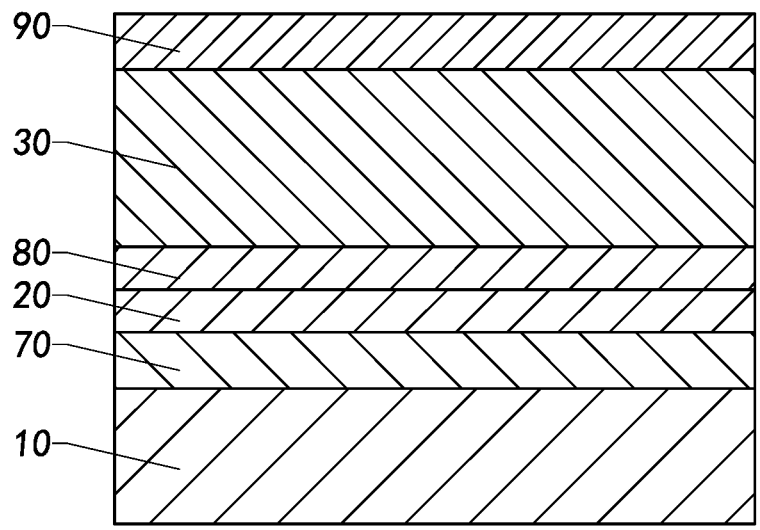
FIG. 6 is a sectional view illustrating a step six of the manufacturing method of the semiconductor chip according to the above preferred embodiment of the present invention.

Next, in the step S5, the protective layer 90 is grown from the quantum well layer 30, as shown in FIG. 6. Specifically, after the internal temperature range of the metal-organic chemical vapor deposition device is lowered to 700° C.-800° C. (including 700° C. and 800° C.), Ga source and nitrogen source are introduced into the metal-organic chemical vapor deposition device to grow the protective layer 90 on the quantum well layer 30 such that the protective layer 90 is stacked on the quantum well layer 30. That is, the protective layer 90 is the low temperature GaN cap layer stacked on the quantum well layer 30. Preferably, the protective layer 90 has a thickness ranging from 30 nm to 100 nm (including 30 nm and 100 nm). By growing the protective layer 90 to the quantum well layer 30, the crystal quality of the quantum well layer 30 can be maintained during next growth processes, for avoiding subsequent high temperature growth damaging the composition and/or structure of the quantum well layer 30.

Figure 7:
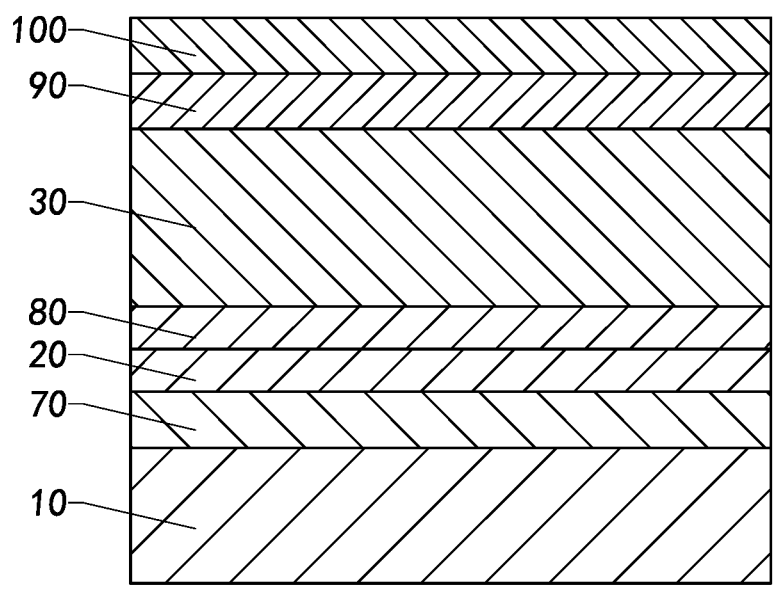
FIG. 7 is a sectional view illustrating a step seven of the manufacturing method of the semiconductor chip according to the above preferred embodiment of the present invention.

Next, in step S6, the electron blocking layer 100 is grown from the protective layer 90, as shown in FIG. 7. Specifically, after the internal temperature of the metal organic compound vapor phase epitaxy apparatus is raised to 900° C.-1000 C (including 900° C. and 1000° C.), Al source, Ga source, nitrogen source, and Mg source are introduced to grow magnesium-doped the electron blocking layer 100 of AlGaN, wherein the doping concentration is $1-10\times10^{18}$ cm$^{-3}$, wherein the Al source, the Ga source, and the nitrogen source are growth sources, N2 is carrier gases, the Mg source is a doped source. Preferably, the electron blocking layer 100 has a thickness ranging from 0.1 μm to 0.5 μm (including 0.1 μm and 0.5 μm).

Figure 8:
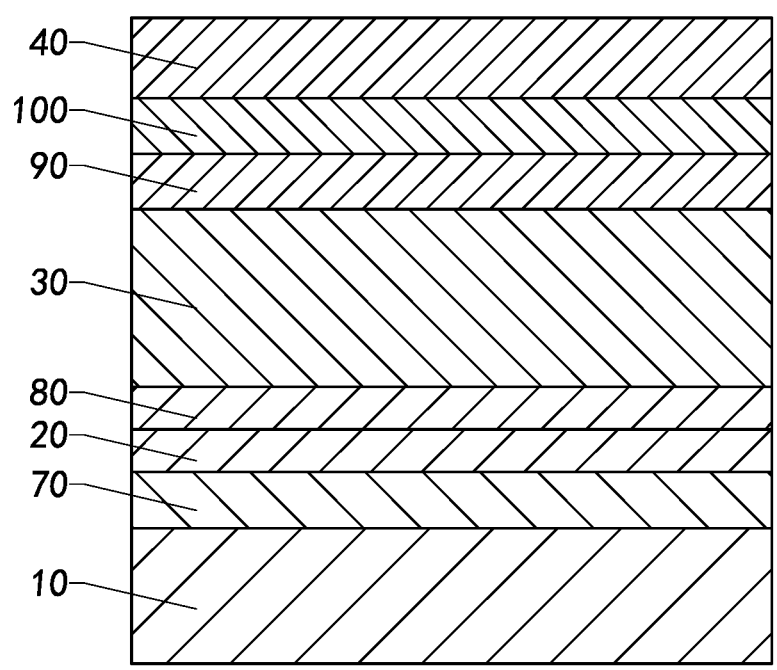
FIG. 8 is a sectional view illustrating a step eight of the manufacturing method of the semiconductor chip according to the above preferred embodiment of the present invention.

Next, in step S7, the P-type gallium nitride layer 40 is grown from the electron blocking layer 100, as shown in FIG. 8. Specifically, Ga source, nitrogen source, and Mg source are introduced into the metal-organic chemical vapor deposition device to grow the Mg-doped P-type gallium nitride layer 40 on the electron blocking layer 100, wherein Ga source and nitrogen source are growth sources, and Mg source is dopant source Preferably, the P-type gallium nitride layer 50 has a thickness ranging from 100 nm to 200 nm (including 100 nm and 200 nm). Preferably, the P-type gallium nitride layer 50 has a doping concentration of $5-10\times10^{18}$ cm$^{-3}$.

Figure 9:
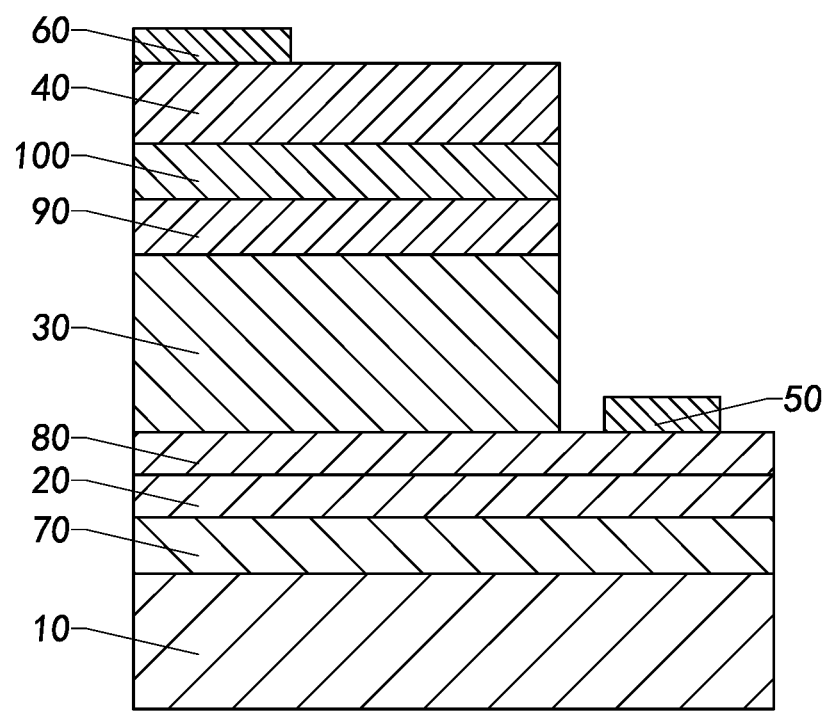
FIG. 9 is a sectional view illustrating the semiconductor chip and a step nine of the manufacturing method thereof according to the above preferred embodiment of the present invention.

In addition, annealing at a temperature ranging from 800° C. to 900° C. (including 800° C. and 900° C.) in a nitrogen (N2) atmosphere for 20 minutes to 30 minutes (including 20 minutes and 30 minutes) to complete the growth of the semiconductor chip. It is worth to mention that, before annealing, the growth step further comprises the step S8, growing the N-type electrode 50 from the current spreading layer 80 and growing the P-type electrode 60 from the P-type gallium nitride layer 40, as shown in FIG. 9.

According to another aspect of the present invention, the present invention further provides a manufacturing method of a semiconductor chip, wherein the manufacturing method comprises the steps of:

(a) stacking the N-type gallium nitride layer 20 on the substrate 10;

(b) cyclically growing the one or more quantum barriers and the one or more quantum wells from the N-type gallium nitride layer 20 to form the quantum well layer 30 on the N-type nitride gallium layer 20 by stacking the quantum barriers and the quantum wells on the N-type gallium nitride layer 20 in sequence successively, wherein the growth pressure of the quantum barrier and the growth pressure of the quantum well are different;

(c) stacking said P-type gallium nitride layer 40 on the quantum well layer 30; and (d) electrically connecting the N-type electrode 50 to the N-type gallium nitride layer 20 and electrically connecting the P-type electrode 60 to the P-type gallium nitride layer 40 to produce the semiconductor chip.

Preferably, the cycle times for growing the quantum barrier and the quantum well are from 3 cycles to 20 cycles.

Preferably, the growth pressure of the quantum barrier is lower than the growth pressure of the quantum well.

In the step (b), the manufacturing method further comprises the steps of:

(b.1) maintaining the substrate 10 stacked with the N-type gallium nitride layer 20 in the metal-organic chemical vapor deposition device;

(b.2) introducing In source, Ga source, nitrogen source, and silane into the metal-organic chemical vapor deposition device to grow doped $Al_{x1}In_{y1}Ga_{1-x1-y1}N$ ($0<X1<1$, $0<Y1<1$) quantum barrier to form the corresponding quantum barrier layered on the N-type gallium nitride layer 20;

(b.3) reducing the pressure of the metal-organic chemical vapor deposition device, and introducing In source, Ga source, and nitrogen source to the metal-organic chemical vapor deposition device to grow undoped $Al_{x2}In_{y2}Ga_{1-x2-y2}N$ ($0<X2<1$, $0<Y2<1$) quantum well to form the corresponding quantum well stacked on the quantum barrier; and (b.4) cycling the step (b.2) and the step (b.3) to stack the quantum well layer 30 on the N-type gallium nitride layer 20.

According to the present invention, it is appreciated that the "stacking/stacked" used in the present invention could be a direct stacking or an indirect stacking. For example, stacking the N-type gallium nitride layer 20 on the substrate 10 may include the meaning that the N-type gallium nitride layer 20 is indirectly stacked on the substrate 10, that is other layers may be disposed between the N-type gallium nitride layer 20 and the substrate 10. For example, the buffer layer 70 may be disposed between the N-type gallium nitride layer 20 and the substrate 10. Correspondingly, stacking the buffer layer 70 on the substrate 10 may also include the meaning that the buffer layer 70 is directly layered on the substrate 10, that is the buffer layer 70 is grown directly on the substrate 10.

It should be noted that the thicknesses of the substrate 10, the buffer layer 70, the N-type gallium nitride layer 20, the current spreading layer 80, the quantum well layer 30, the protective layer 90, the electron blocking layer 100, the N-type electrode 50, and the P-type electrode 60 of the semiconductor chip as shown in the drawings of the present invention are merely for illustration purpose as example, but not intending to represent the actual real thicknesses of the substrate 10, the buffer layer 70, the N-type gallium nitride layer 20, the current spreading layer 80, the quantum well layer 30, the protective layer 90, the electron blocking layer 100, the N-type electrode 50, and the P-type electrode 60. Moreover, person skilled in the art should realize that the real dimensional proportion of the substrate 10, the buffer layer 70, the N-type gallium nitride layer 20, the current spreading layer 80, the quantum well layer 30, the protective layer 90, the electron blocking layer 100, the N-type electrode 50, and the P-type electrode 60 are not exactly as shown in the drawings.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention comprises all modifications encompassed within the spirit and scope of the following claims.

What is claimed is:

1. A semiconductor chip of a light emitting diode, comprising:
   a substrate;
   an N-type gallium nitride layer, which is stacked on said substrate;
   a quantum well layer, which is stacked on said N-type gallium nitride layer, wherein said quantum well layer comprises one or more quantum barriers and one or more quantum wells stacked successively in sequence, wherein a growth pressure of said one or more quantum barriers and a growth pressure of said one or more quantum wells are different;
   a P-type gallium nitride layer, wherein said P-type gallium nitride layer is stacked on said quantum well layer;
   an N-type electrode, electrically connected to said N-type gallium nitride layer;
   a P-type electrode, electrically connected to said P-type gallium nitride layer; and
   a current spreading layer stacked on and electrically connected to said N-type gallium nitride layer, wherein said quantum well layer is stacked on said current spreading layer while said N-type electrode is stacked on and electrically connected to said current spreading layer, such that said N-type gallium nitride layer is electrically connected to said N-type electrode via said current spreading layer for a current from said N-type electrode capable of entering to said quantum well layer through said N-type gallium nitride layer.

2. The semiconductor chip, as recited in claim 1, wherein said growth pressure of said one or more quantum barriers is lower than said growth pressure of said one or more quantum wells of said quantum well layer.

3. The semiconductor chip, as recited in claim 2, wherein a number of layers of said quantum barrier and a number of layers of said quantum well of said quantum well layer are both parameterized as N, having a value range of: $3 \leq N \leq 20$.

4. The semiconductor chip, as recited in claim 3, wherein each of said one or more quantum barriers of said quantum well layer is a doped quantum barrier of $Al_{x1}In_{y1}Ga_{1-x1-y1}N$ ($0<X1<1$, $0<Y1<1$), having a doped concentration of $1\text{-}5\times10^{18}$ cm-3, wherein each of said one or more quantum wells of said quantum well layer is an undoped quantum well of $Al_{x2}In_{y2}Ga_{1-x2-y2}N$ ($0<X2<1$, $0<Y2<1$), wherein each of said one or more quantum barriers of said quantum well has a thickness ranging from 5 nm-15 nm, and each of said one or more quantum wells has a thickness ranging from 2 nm-5 nm.

5. The semiconductor chip, as recited in claim 4, further comprising a buffer layer, wherein said buffer layer is stacked on said substrate and said N-type gallium nitride layer is stacked on said buffer layer, wherein said buffer layer is selected from the group consisting of a GaN buffer layer and an AlN buffer layer.

6. The semiconductor chip, as recited in claim 5, wherein said current spreading layer is one of an N-type current spreading layer, an AlGaN current spreading layer, and an InGaN current spreading layer.

7. The semiconductor chip, as recited in claim 6, further comprising a protective layer and an electron blocking layer, wherein said protective layer is stacked on said quantum well layer and said P-type gallium nitride layer is stacked on said protective layer, wherein said electron blocking layer is stacked on said protective layer, and said P-type gallium nitride layer is stacked on said electron blocking layer, wherein said N-type electrode is stacked on said current spreading layer and said P-type electrode is stacked on said P-type gallium nitride layer, wherein said protective layer is a GaN cap layer, wherein said protective layer has a thickness ranging from 30 nm to 100 nm, wherein said electron blocking layer is a P-type AlGaN electron blocking layer, wherein said electron blocking layer has a doped concentration of $1\text{-}10\times10^{18}$ cm$^{-3}$, wherein said electron blocking layer has a thickness ranging from 0.1 μm to 0.5 μm.

8. The semiconductor chip, as recited in claim 2, wherein said current spreading layer is one of an N-type current spreading layer, an AlGaN current spreading layer, and an InGaN current spreading layer.

9. The semiconductor chip, as recited in claim 4, wherein said current spreading layer is one of an N-type current spreading layer, an AlGaN current spreading layer, and an InGaN current spreading layer.

10. The semiconductor chip, as recited in claim 4, further comprising a protective layer and an electron blocking layer, wherein said protective layer is stacked on said quantum well layer and said P-type gallium nitride layer is stacked on said protective layer, wherein said electron blocking layer is stacked on said protective layer, and said P-type gallium nitride layer is stacked on said electron blocking layer, wherein said N-type electrode is stacked on said current spreading layer and said P-type electrode is stacked on said P-type gallium nitride layer, wherein said protective layer is a GaN cap layer, wherein said protective layer has a thickness ranging from 30 nm to 100 nm, wherein said electron blocking layer is a P-type AlGaN electron blocking layer, wherein said electron blocking layer has a doped concentration of $1\text{-}10\times10^{18}$ cm$^{-3}$, wherein said electron blocking layer has a thickness ranging from 0.1 μm to 0.5 μm.

11. The semiconductor chip, as recited in claim 5, further comprising a protective layer and an electron blocking layer, wherein said protective layer is stacked on said quantum well layer and said P-type gallium nitride layer is stacked on said protective layer, wherein said electron blocking layer is stacked on said protective layer, and said P-type gallium nitride layer is stacked on said electron blocking layer, wherein said N-type electrode is stacked on said current spreading layer and said P-type electrode is stacked on said P-type gallium nitride layer, wherein said protective layer is a GaN cap layer, wherein said protective layer has a thickness ranging from 30 nm to 100 nm, wherein said electron blocking layer is a P-type AlGaN electron blocking layer, wherein said electron blocking layer has a doped concentration of $1\text{-}10\times10^{18}$ cm$^{-3}$, wherein said electron blocking layer has a thickness ranging from 0.1 μm to 0.5 μm.

12. The semiconductor chip, as recited in claim 1, wherein each of said one or more quantum barriers of said quantum well layer is a doped quantum barrier of Alx1Iny1Ga1-x1-y1N (0<X1<1, 0<Y1<1), having a doped concentration of 1-5x1018 cm-3, wherein each of said one or more quantum wells of said quantum well layer is an undoped quantum well of Alx2Iny2Ga1-x2-y2N (0<X2<1, 0<Y2<1).

13. The semiconductor chip, as recited in claim 12, wherein each of said one or more quantum barriers of said quantum well layer has a thickness ranging from 5 nm-15 nm, and each of said one or more quantum wells has a thickness ranging from 2 nm-5 nm.

14. The semiconductor chip, as recited in claim 1, further comprising a buffer layer, wherein said buffer layer is stacked on said substrate and said N-type gallium nitride layer is stacked on said buffer layer.

15. The semiconductor chip, as recited in claim 14, wherein said buffer layer is GaN buffer layer.

16. The semiconductor chip, as recited in claim 1, wherein said current spreading layer is one of an N-type current spreading layer, an AlGaN current spreading layer, and an InGaN current spreading layer.

17. The semiconductor chip, as recited in claim 1, further comprising a protective layer, stacked on said quantum well layer to maintain crystal quality thereof, wherein P-type gallium nitride layer is stacked on said protective layer.

18. The semiconductor chip, as recited in claim 17, further comprising an electron blocking layer, which is stacked on said protective layer, and said P-type gallium nitride layer is stacked on said electron blocking layer.

19. The semiconductor chip, as recited in claim 18, wherein said P-type electrode is stacked on said P-type gallium nitride layer, wherein said protective layer is a GaN cap layer, wherein said protective layer has a thickness ranging from 30 nm to 100 nm, wherein said electron blocking layer is a P-type AlGaN electron blocking layer, wherein said electron blocking layer has a doped concentration of $1\text{-}10\times10^{18}$ cm$^{-3}$, wherein said electron blocking layer has a thickness ranging from 0.1 μm to 0.5 μm.

* * * * *